United States Patent
Yamamoto

(10) Patent No.: US 6,587,491 B1
(45) Date of Patent: Jul. 1, 2003

(54) SEMICONDUCTOR LASER

(75) Inventor: Takeshi Yamamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 277 days.

(21) Appl. No.: 09/684,954

(22) Filed: Oct. 5, 2000

(30) Foreign Application Priority Data

Oct. 6, 1999 (JP) ............................................. 11-286089

(51) Int. Cl.⁷ ................................................. H01S 3/18
(52) U.S. Cl. ............................. 372/43; 372/65; 372/36
(58) Field of Search ............................. 372/43, 36, 50, 372/65, 61

(56) References Cited

U.S. PATENT DOCUMENTS

| | | | | |
|---|---|---|---|---|
| 4,768,070 A | * | 8/1988 | Takizawa et al. | 372/31 |
| 5,052,009 A | * | 9/1991 | Tsuboi et al. | 372/36 |
| 5,068,866 A | * | 11/1991 | Wada et al. | 372/36 |
| 5,140,384 A | * | 8/1992 | Tanaka | 357/17 |
| 5,324,387 A | * | 6/1994 | Andrews et al. | 438/28 |
| 5,391,865 A | * | 2/1995 | Kurata | 250/201.5 |
| 5,399,858 A | * | 3/1995 | Kinoshita | 250/239 |
| 5,414,293 A | * | 5/1995 | Broom | 257/433 |
| 5,516,727 A | * | 5/1996 | Broom | 438/26 |
| 5,557,116 A | * | 9/1996 | Masui et al. | 257/100 |
| 5,748,658 A | * | 5/1998 | Nakanishi | 372/43 |

* cited by examiner

*Primary Examiner*—Leon Scott, Jr.
(74) *Attorney, Agent, or Firm*—Arent Fox Kintner Plotkin & Kahn

(57) ABSTRACT

A support section is provided on one side of a stem, which is secured such that at least two leads are projected from both sides. A heat sink section is formed on the upper portion of the support section in a wide width extending to the side of the projecting two leads. A laser chip is mounted on the heat sink section. As a consequence, in the event of a laser chip having a large chip size and a large calorific value, the heat sink section is large-sized to improve heat dissipation characteristics, thereby obtaining a semiconductor laser having a small outside diameter and a thin type optical pickup.

9 Claims, 6 Drawing Sheets

SEMICONDUCTOR LASER

FIELD OF THE INVENTION

The present invention relates to a small-sized and inexpensive semiconductor laser suitable for use as a pickup light source in, for example, DVDs (digital video disks) and DVD-ROMs. More particularly, it relates to a stem type semiconductor laser which can be formed in a small outside dimension even if a laser chip for DVDs is large-sized.

BACKGROUND OF THE INVENTION

The stem type semiconductor laser used as conventional pickups for CDs has such a structure as shown in FIG. 7. Specifically, a stem 20 is used which is produced by forming a metallic material such as iron by cold forging, raising a part of the center portion of a base 21 to form a heat sink section 22 and fixing leads 23 and 25 by using a glass 26 or the like. A laser chip 31 is mounted on the heat sink section 22 through a submount 34 made of a silicon substrate or the like. One electrode (backface electrode of the chip 31) is electrically connected to the lead 23 through a relay portion 38 of the submount 34 by a wire 33 and another electrode is connected to the submount 34 through a wire 33 and is also electrically connected to a common lead 24 by way of the heat sink section 22 and the base 21 via the backface of the submount 34. 32 represents a light receiving element for monitor. One electrode of the light receiving element 32 is electrically connected to a lead 25 through a wire 33 and another electrode is electrically connected to the common lead 24 through the submount 34, the heat sink section 22 and the base 21. The periphery of these portions is covered by a cap 35 to form the semiconductor laser. A through-hole 35a is formed in the center of the top of the cap 35 to transmit light emitted from the laser chip 31 and a glass plate 36 is sealed by an adhesive 37.

In this structure, although the heat sink section 22 must be formed between the leads 23 and 25, the leads 23 and 25 must be sealed by the glass 26 or the like. It is therefore impossible to decrease the diameter of the stem 20. Hence, only semiconductor lasers having an outside dimension of about 5.6 mm φ have been manufactured.

On the other hand, as shown in FIG. 8, there is a type obtained by processing a plate-like body by drawing to form a ring 27 and a pedestal portion 28 to be a heat sink into one united body, directly sealing leads 23 and 25 within the ring 27 by using a glass 29 or the like to form a stem 20 and a cap 35 is allowed to cover the periphery of the stem 20 by press fitting. By making the semiconductor laser having such a structure, it is unnecessary to form the heat sink section directly on the base of the stem and also a space used to weld the cap. Hence a semiconductor laser with a diameter of about 3.3 mm φ is produced. In FIG. 8, the same parts as in FIG. 7 are represented by the same symbols and the explanations of these parts are omitted.

As to a light source used for the conventional pickups for CDs, the size of a laser chip used in the light source is about a 0.25 mm by 0.25 mm square and operating current is small. Even if a semiconductor laser having the structure shown in the aforementioned FIG. 8 is used as the light source, no problem arises because the operating current is small to reduce the calorific value. On the contrary, a laser chip for DVDs is as large as about a 0.25 mm by 0.5 mm square and operating current is about two times that of the chips for CDs. There is the problem that insufficient heat dissipation results in no emission of the laser chip. Because of this reason, it is necessary to make the heat sink section as large as possible to thereby promote heat dissipation. Moreover, in the structure shown in FIG. 8, it is necessary to form a thick solder plating on the surface of the stem since the cap is fitted by press fitting, giving rise to the problem that a thick solder plating is formed on a lead, leading to difficult wire bonding.

While, for pickups used to detect signals of, for example, CDs or DVDs, very thin types are required along with the development of light-weight, thin and small-sized electronic equipment as typified by recent note-type personal computers. As a semiconductor laser used side-wise in a pickup, one having a small diameter is needed. For even types which are made to have a large chip size and must have good heat dissipation characteristics, it is desired to decrease the outside diameter to about 3.3 mm φ or less.

SUMMARY OF THE INVENTION

The present invention has been conducted in view of the aforementioned situation and has an object of providing a semiconductor laser having a small outside diameter, the semiconductor laser being improved in heat dissipation characteristics by making a heat sink section large even if a laser chip having a large chip size and a large calorific value is used.

Another object of the present invention is to make such an optical pickup as used in a note type personal computer thinner and to provide an optical pickup device which allows electronic equipment to be thinner.

A semiconductor laser according to the present invention comprises: a stem which is secured such that at least two leads are projected from both sides; a support section disposed on one side bottom (lead-fixed section) of the stem; a heat sink section formed on the upper portion of the support in a wide width extending to the side of the two leads; and a laser chip secured to the heat sink section.

Here, the meaning that the heat sink section is formed in a wide width extending to the side of the two leads implies either one or both of the case where the support section disposed between the two leads extends in the direction of the width of the leads and the case where the support section disposed behind the lead extends to the side of the front lead (in a direction perpendicular to the direction of the width of the leads). It is to be noted that the portion formed in a wide width may be wide in width either such that it covers the upper portion of the top of the lead or to the extent that it covers the glass portion securing the leads though it uncovers the top of the leads.

This structure ensures that even if the support section is limited in width by the interval between the leads and the like on a plan view (viewing the stem from the above), the volume of the heat sink section can be secured even if the interval between the leads is narrow because in the structure, the heat sink section is overlapped on the leads (including the glass portion securing the leads). As a result, a heat sink section enough to dissipate heat can be provided even if the interval between the leads is made narrow to obtain a semiconductor laser with an outside diameter of 3.3 mm φ. Also, even laser chips, such as those for DVDs, having a large chip size and a large calorific value can be made into small packages. That is, conventional semiconductor lasers of this type are manufactured based on the idea that a heat sink section and a support section have the same widths and the heat sink portion and leads are arranged such as in line on a plan view; therefore, a restriction is imposed on the interval of the leads in the stem and such a restriction that the heat sink section cannot be made large is imposed. However, by adopting such an idea that the heat sink section is extended and made large so as to overlap on the leads on a plan view, even semiconductor lasers for DVDs having a large chip size and a large calorific value could be formed into a small-sized one with an outside diameter of about 3.3 mm φ.

Preferably the stem is formed by securing the at least two leads to the through-hole of the metal base with an insulated material, the support section is integrated with the base and the heat sink section is stuck to the support section. This structure makes it possible to use a copper material or the like having high heat conductivity for the heat sink section.

Preferably the aforementioned at least two leads are secured to the through-hole of the metallic base with an insulated material to form the stem and the support section and the heat sink section are integrated with the base. By this structure, dimensional accuracy is bettered and the assembly is made easy.

Preferably the support section and the heat sink section are formed as an integral subject by using a metallic material, for example, a metal block or plate material and the support section of the integral subject is secured to the base of the stem. This structure makes the production step of the stem easier.

The stem may be a type which is formed by sealing at least two leads in a cylinder ring with an insulated material. Even if this type is used, a semiconductor laser having a laser chip, such as those for DVDs, having a large chip size and a high calorific value can be made because of the provision of the heat sink section which is formed in a wide width and improved in heat dissipation.

An optical pickup device according to the present invention comprises: a semiconductor laser; a diffraction grating; a beam splitter which separates the light emitted from the semiconductor laser from the light returned by being reflected on the disk; a collimator lens which collimates beam from the semiconductor laser; a reflecting mirror which bends the beams from the semiconductor laser at a right angle; an objective lens which focuses the beam on the disk; and a light detector which detects the light reflected from the disk and separated by the beam splitter; wherein the semiconductor laser comprises the aforementioned semiconductor laser.

BRIEF DESCRIPTION OF THE DRAWINGS

In the accompanying drawings, there are shown illustrative embodiments of the invention from which these other of its objectives, novel features, and advantages will be readily apparent.

In the drawings.

DETAILED DESCRIPTION

Figure 1:
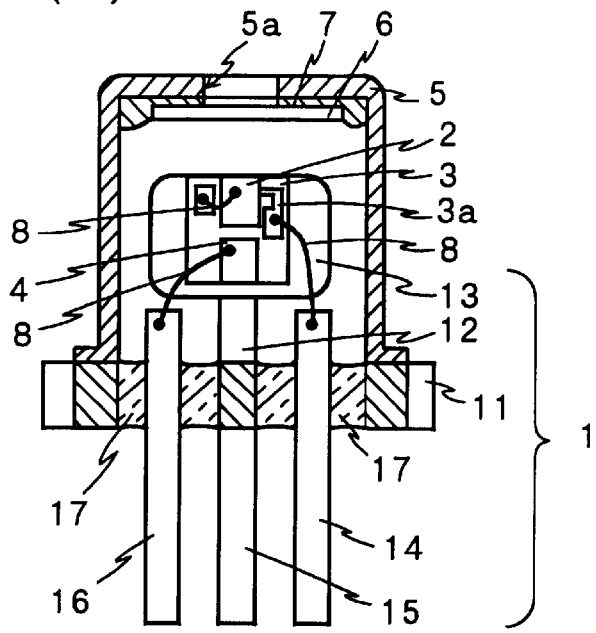
FIG. 1(a) to FIG. 1(c) are explanatory views showing the structure of an embodiment of a semiconductor laser according to the present invention.
Figure 1:
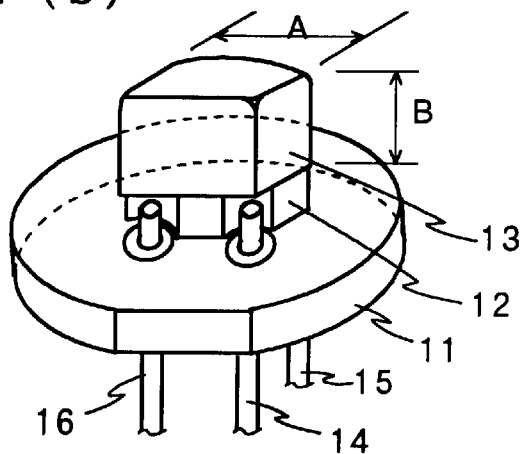
Figure 1:
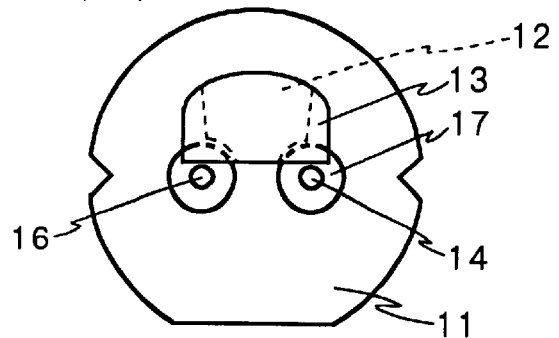

Next, a semiconductor laser according to the present invention will be explained with reference to the drawings. As shown by an explanatory sectional view of an embodiment of the semiconductor laser of the present invention and a perspective and a plan view of a stem section of the semiconductor laser in FIG. 1(a) to FIG. 1(c) respectively, the semiconductor laser of the present invention is provided with a support section 12 on one side bottom (base 11) of a stem 1 which is secured such that at least two leads 14 and 16 project from both sides. A heat sink section 13 is formed on the upper portion of the support section 12 in a wide width extending to the side of the aforementioned two leads 14 and 16. A laser chip 2 is mounted on the heat sink section 13.

The stem 1 comprises the base 11, the support section 12, the heat sink section 13, the leads 14 and 16 which are sealed in a through-hole formed in the base 11 by using a soft glass 17 and a lead 15 provided directly on the base 11 by welding. In the example shown in FIG. 1, the base 11 is integrated with the support 12, which is formed, for example, by using an iron plate, specifically, a projecting portion to be the support section 12 is formed on the center of the iron plate by using a cold forging method. As to the base 11, its thickness is, for example, 1 mm and its diameter is about 3.3 mm φ. The support section 12 is formed such that its width is the same as or slightly narrower than the space sandwiched between the through-holes of the base 11 in the part faced to the leads 14 and 16 and is as wider as about 1.1 mm (almost the same as the center distance between the leads 14 and 16) in the part behind the leads 14 and 16. The though-holes respectively securing the leads 14 and 16 are formed such that each diameter is, for example, about 0.75 mm φ and the interval between the through-holes is about 1.1 mm φ.

The leads 14 and 16 are respectively made of a Fe-Ni alloy rod with a diameter of 0.3 mm φ and sealed in the through-hole of the base 11 by using glass beads made of the soft glass 17 or the like. The common lead 15 is also formed of the same material and is secured directly to the base 11 by welding to connect electrically to the base 11.

The heat sink section 13 is, in the example shown in FIG. 1, formed separately from the support section 12 and is made of a copper block. As for the heat sink section 13, as shown by an explanatory plan view in FIG. 1(c), its wide width portion is formed in a manner that it extends out from the support 12 towards the side of the leads 14 and 16, the width A in the direction in which the leads 14 and 16 are arranged is, for example, about 1.4 mm and the height B is about 1.1 mm. The heat sink section 13 is secured to the support section 12 by soldering. Specifically, although the front width of only the support section is merely about 0.4 mm which is the distance of the space between the through-holes, the front width of the heat sink section 13 is extended to about 1.4 mm. Hence, a submount used for bonding the laser chip can be secured without fail and the heat conducted to the submount from the laser chip can be dissipated efficiently.

Figure 2:
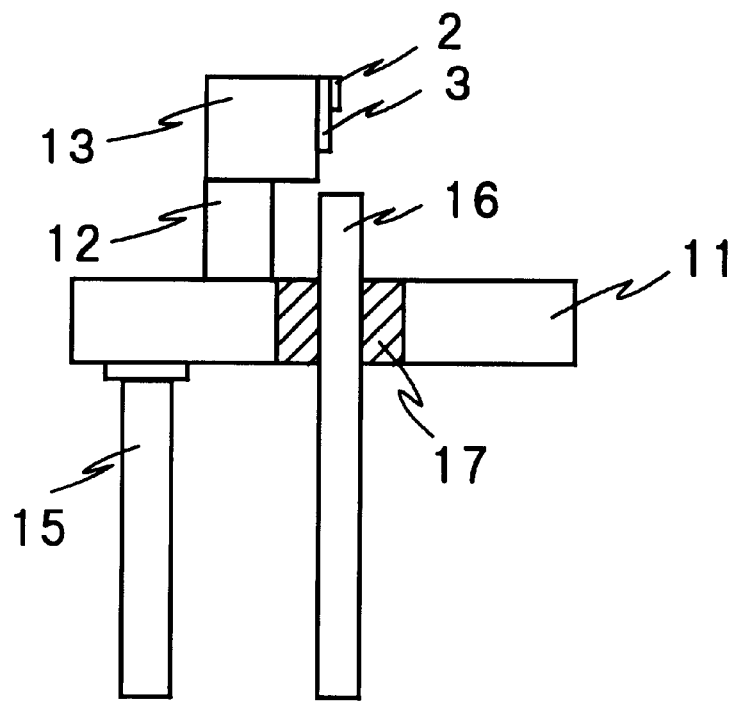
FIG. 2(a) and FIG. 2(b) are explanatory views showing another structural example in which the heat sink section of FIG. 1(a) to FIG. 1(c) is made large.
Figure 2:
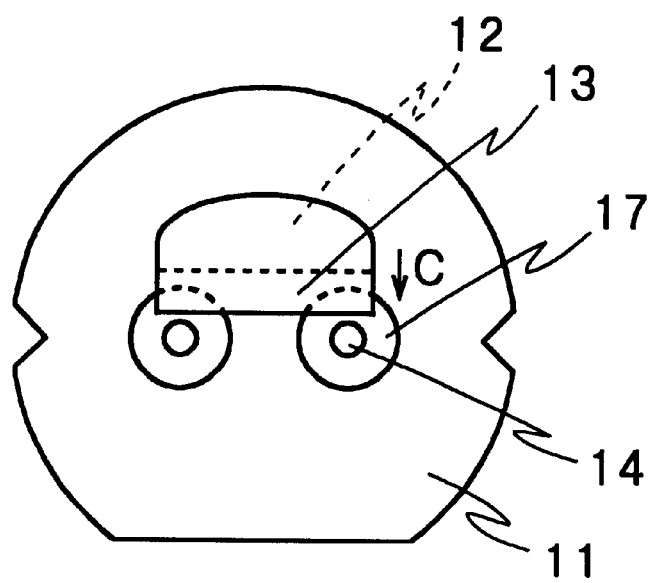

In the example shown in FIG. 1, the heat sink section 13 is formed in a wide width by making the width thereof larger than the width of the support 12 in the direction (lateral direction) in which the leads 14 and 16 are arranged in line. However, as shown in FIG. 2(*a*) and 2(*b*), the support section 12 may be formed in a wide width behind the leads 14 and 16 and the heat sink section 13 may be formed in a wide width by extending it from the support section 12 towards the side (direction C in FIG. 2(*b*)) of the leads or may be formed in a wide width in both directions by extending also in the direction in which the leads are arranged in line. Essentially, the semiconductor laser is characterized by the fact that the heat sink section 13 is formed such that the area thereof on a plan view is larger than that of the support section 12 and the laser chip is mounted in the wide area of the heat sink section 13 such that a light emitting portion is positioned in the center of the stem. Also, though in the aforementioned example, the heat sink section 13 is formed separately from the support section 12, the heat sink section 13 may be integrated either with the support section 12 or with the base 11 and the support section 12 as will be explained later.

The laser chip 2 is formed so as to emit laser light. The size of the laser chip 2 is about 250 μm×250 μm for CDs but is as large as about 250 μm×500 μm for DVDs. However these sizes are rather very small and the laser chip 2 is usually secured by bonding to the submount 3 made of, for example, a silicon substrate of about 0.8×1 mm. One electrode of the laser chip 2 is connected to the submount 3 by wire bonding using a gold wire 8 and to the common lead 15 from the backface of the submount 3 via the heat sink section 13, the support 12 and the base 11 by a conductive adhesive. Another electrode (backface electrode) is connected to the lead 14 via a connecting portion 3*a* on the submount 3 by wire bonding using a gold wire 8.

The submount 3 to which the laser chip 2 is bonded is carried by an adsorption collet and mounted on the heat sink section 13. Also, a light receiving element 4 used to monitor the output of the emitted light is likewise disposed on the submount 3 and one electrode of the light receiving element 4 is connected to the common lead 15 via the heat sink section 13 and the like and another electrode is electrically connected to the lead 16 by wire bonding using a gold wire 8 or the like. It is to be noted that the light receiving element 4 may be disposed on a place other than the submount 3.

A cap (shell) 5 is disposed on the periphery of the laser chip 2 by welding the cap 5 to the stem 1; that is, projections are formed on the entire surface of the bottom (part which is in contact with the stem 1) of the cap 5 and all the periphery is hermetically sealed by resistance welding such that current is concentrated on the projections. Although the cap 5 is preferably made of a material, such as copper, which has good conductivity, it may be made of a metal such as iron or Kovar(Fe—Ni—Co alloy), which has good weldability. Also, preferably the cap 5 is provided with matt silver plating to prevent irregular reflection of light in the inner surface. In the center of the top of the cap 5, a window portion (through-hole) 5*a* through which laser beam passes is formed and a transparent plate 6 is applied to the window portion 5*a* by using an adhesive 7 such as a low melting point glass.

In the semiconductor laser of the present invention, the heat sink section is formed in a width wider than the support section; therefore, if the interval between the leads is narrower (regardless of the interval between the leads), a laser chip can be mounted on a large heat sink which can sufficiently dissipate heat. As a consequence, even a laser chip for DVDs which has a large chip size, requires a large operating current and has a high calorific value can be mounted on a stem having a small outside diameter. Among conventional chips used for CDs which is relatively small and has a small calorific value, those of a type provided with a stem produced by cold forging need, for instance, a space corresponding to the diameter of the glass used to secure the leads and a space required to form a part for welding the cap. Hence a small-sized semiconductor laser can be attained. Only those using a cylinder ring can be small-sized. On the contrary, the present invention ensures that even in the case of those of a type provided with a stem produced by cold forging, a small-sized semiconductor laser having a diameter of about 3.3 mm φ can be produced.

Owing to the possibility of using this metallic stem, the cap can be formed on the stem by resistance welding as aforementioned. As a consequence, the airtightness can be remarkably improved and solder plating required to carry out press fitting is not needed. Because no-solder plating is formed on the leads, the wire bonding characteristics can be very improved.

Figure 3:
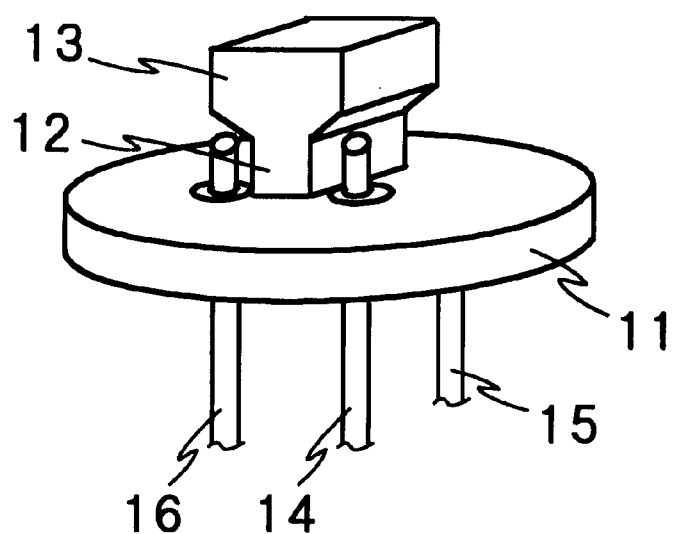
FIG. 3 is an explanatory view showing the structure of another embodiment of a semiconductor laser according to the present invention.

In the above example, the heat sink section 13 is produced separately from the support section 12 by using a material differing from that of the support section 12 and secured to the support section 12 by soldering or the like. If the heat sink section 13 is formed as a separate body, this is preferable because a copper block having, particularly, high heat conductivity may be used. However, as shown by an explanatory perspective view of the stem section of another example in FIG. 3, the heat block section 13, the base 11 and the support section 12 can be formed as an integral body from an iron plate by cold forging. If these parts are formed as an integral body, this has the advantage that it is unnecessary to secure the heat block section 13 and the semiconductor laser can be produced with high accuracy.

Figure 4:
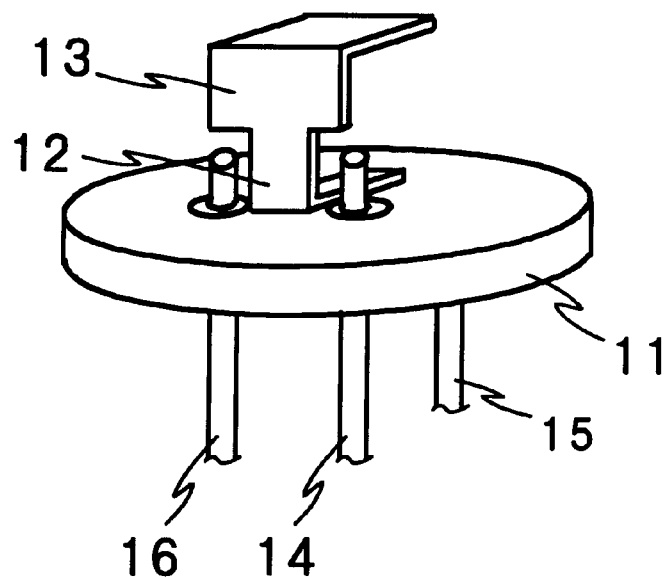
FIG. 4 is an explanatory view showing the structure of a further embodiment of a semiconductor laser according to the present invention.

To state a further example, a structure may be adopted in which the support section 12 and the heat block section 13 are formed as an integral body by punching and bending a copper plate and the support section 12 of the integral body is secured to the base by welding or soldering as shown by an explanatory perspective view of the similar stem section in FIG. 4. As shown in FIG. 4, the heat sink section can be formed such that the surface area of the heat sink section increased in a limited space by producing the bent heat sink section and hence the heat dissipation characteristics can be improved. Other parts are the same as in the aforementioned example; so the same parts are represented by the same symbols and the explanations of these parts are omitted.

Figure 5:
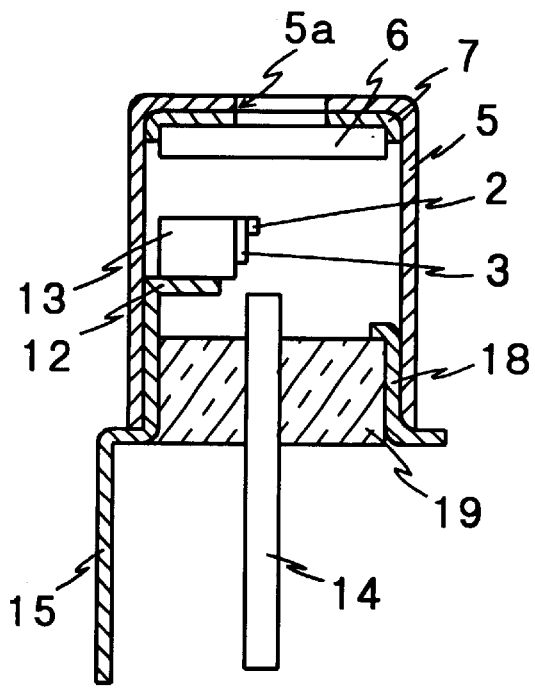
FIG. 5(a) and FIG. 5(b) are explanatory views showing the structure of a still further embodiment of a semiconductor laser according to the present invention.
Figure 5:
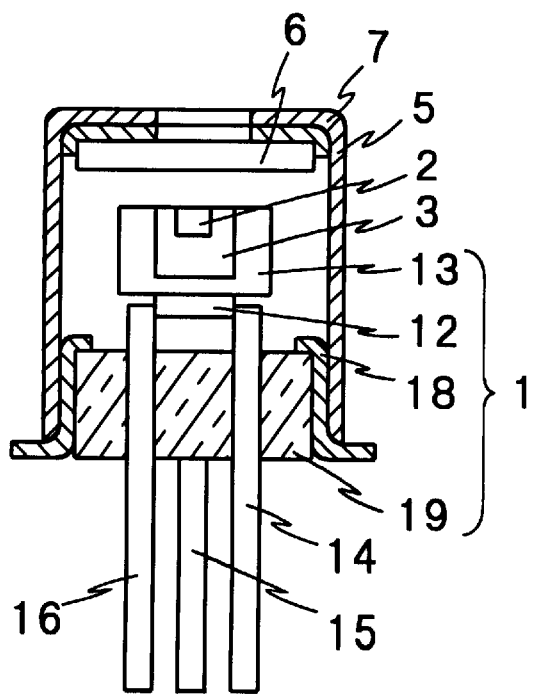

FIG. 5(*a*) and FIG. 5(*b*) are explanatory views showing sill further examples in sections in perpendicular directions respectively. These examples are provided with a heat sink section having a wide width so that a large laser chip for DVDs can be mounted in a conventional small package having a diameter of 3.3 mm. To state specifically, a cylinder ring 18 is formed by the aforementioned drawing of a copper plate and the leads 14 and 16 are sealed in the ring 18 by using a glass 19 to form the stem 1. The support section 12 and the common lead 15 are integrated with the ring 18. Then, on the support section 12, the heat sink section 13 having a width wider than that of the support section 12 is formed by securing it to the support section 12. Parts other than the stem 1 are the same as in the aforementioned example; so the same parts are represented by the same symbols and the explanations of these parts are omitted. Although in FIG. 5(*a*) and FIG. 5(*b*), the light receiving element is not shown, it is disposed in the same manner as in the above example.

Figure 6:
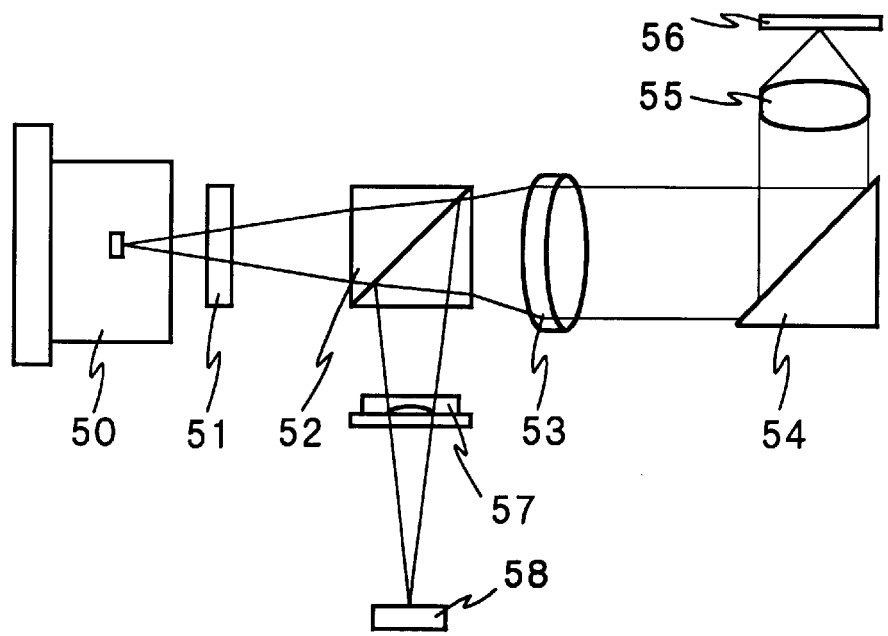
FIG. 6 is an explanatory view of the structure of a pickup according to the present invention.
Figure 7:
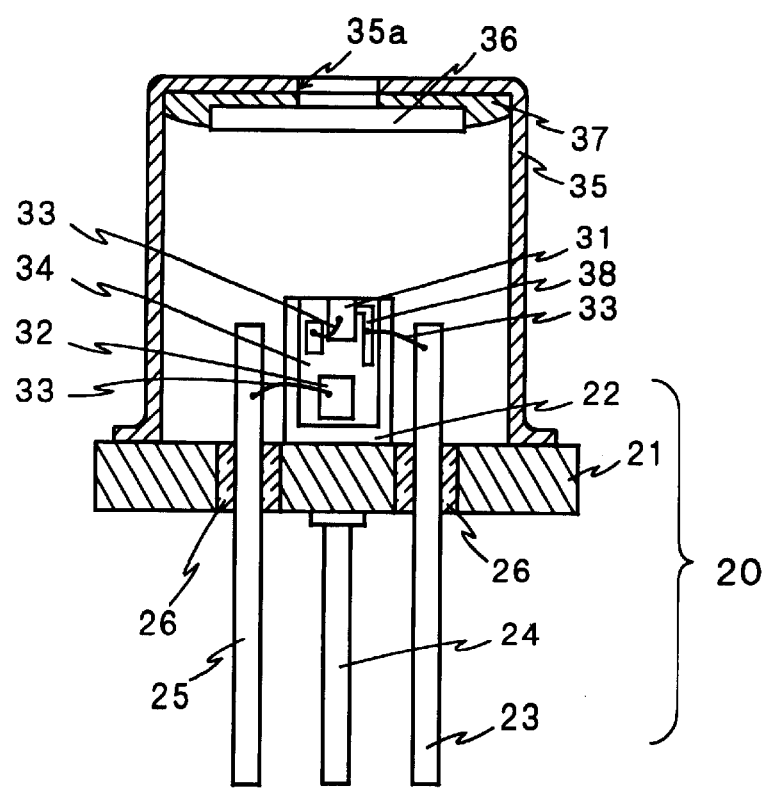
FIG. 7 is an explanatory view of a structural example of a conventional semiconductor laser.
Figure 8A:
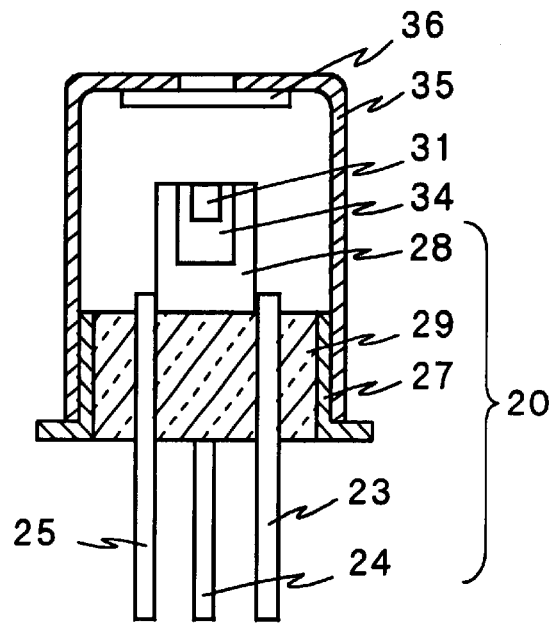
FIG. 8(a) and FIG. 8(b) are explanatory views of a structural example of a conventional semiconductor laser.
Figure 8B:
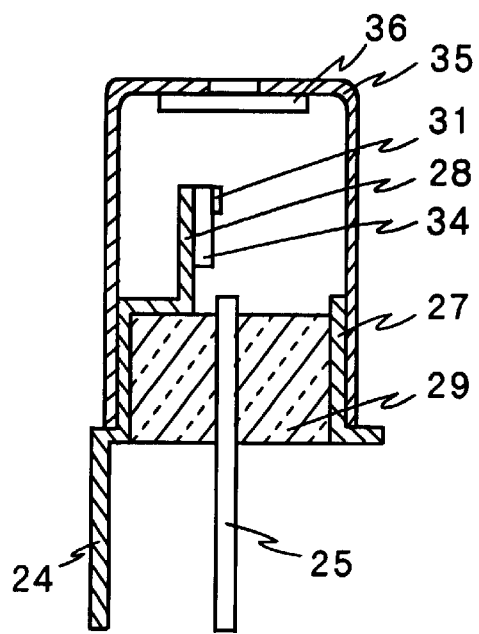

FIG. 6 is an explanatory view schematically showing an example of the structure of a thin type pickup using the semiconductor laser having a small diameter. Specifically, in this structure, a semiconductor laser 50 is disposed sidewise, light, namely, a laser beam from the semiconductor laser is, for example in a three-beam method, divided into three beams by using a diffraction grating 51, these beams are collimated by a collimator lens 53 via a beam splitter 52 which separates emitted light from reflected light and the beams (parallel to the z axis) are bent at an angle of 90 degrees by a prism mirror (reflecting mirror) 54 and are allowed to focus on the surface of a disk 56 of a DVD, a CD or the like by an objective lens 55. Then the reflected light from the disk 56 is detected by a light detector 58 through a beam splitter 52 by way of a concave lens 57. It is to be noted that the semiconductor laser 50 and the light detector 58 are placed on the same flat (xy plane) in FIG. 6.

In such a structure in which the semiconductor laser 50 is disposed side-wise and the laser beam is emitted in parallel to a DVD or the like to detect the irregularities of the surface of the DVD or the like, the development of a thin type optical pickup depends on the outside diameter of the semiconductor laser and hence a very thin type optical pickup can be constituted by decreasing the outside diameter. As aforementioned, an optical pickup with a thickness of about 5 mm was obtained by using the semiconductor laser having an outside diameter of 3.3 mm φ according to the present invention.

According to the present invention, even if such a stem as is formed by a cold forging and having a metallic base, a very small type semiconductor laser having a diameter of about 3.3 mm φ can be obtained. Hence, a semiconductor laser which is free from the deformation of the material, is improved in heat dissipation and is highly reliable is obtained. Moreover, the use of the stem provided with the metallic base results in that the cap can be welded and high airtightness is obtained easily.

Moreover, because a sufficiently large heat sink section can be formed without any restrictions by the interval between the leads, even a laser chip, such as those for DVDs, having a large chip size and high calorific value can be mounted without increasing the outside dimension of the stem.

As a result, a very thin type pickup even for DVDs can be formed. Also, a pickup using the semiconductor laser of the present invention contributes greatly to the development of a thin type electronic equipment, such as note type personal computers, using a laser light source.

As this invention may be embodied in several forms without departing from the spirit of essential characteristics thereof, the foregoing embodiments are therefore illustrative and should not be interpreted as restrictive, and all changes that fall within equivalence of claims are therefore intended to be embraced by the claims.

What is claimed is:

1. A semiconductor laser comprising:
   a stem in which at least two leads penetrate through-holes of a base and are secured to said base with an insulated material so that said at least two leads are projected from both sides of said base;
   a support section provided on one side of said stem;
   a heat sink section formed on the upper portion of said support section, said heat sink section having a wide width portion extending to the side of said at least two leads which is wider in a width than said support section; and
   a laser chip secured to said heat sink section.

2. A semiconductor laser according to claim 1, wherein said stem is formed by securing said at least two leads to a metallic base, and said support section is integrated with said metallic base and said heat sink section is stuck to said support section.

3. A semiconductor laser according to claim 1, wherein said stem is formed by securing said at least two leads to a metallic base, and said support section said heat sink section are integrated with said metallic base.

4. A semiconductor laser according to claim 1, wherein said support section and said heat sink section are formed as an integral subject by using a metallic material and said support section of said integral subject is secured to said base of said stem.

5. A semiconductor laser according to claim 4, wherein said metallic material comprises a metallic plate material.

6. A semiconductor laser according to claim 1, wherein said laser chip is secured to said heat sink section through a submount.

7. A semiconductor laser according to claim 1, wherein said laser chip side of said stem is covered by a cap provided with a transmitting window which transmits light from said laser chip.

8. A semiconductor laser comprising:
   a stem in which at least two leads are secured to a cylindrical ring with an insulated material so that said at least two leads are projected from both sides of said cylindrical ring;
   a support section provided on one side of said stem;
   a heat sink section formed on the upper portion of said support section, said heat sink section having a wide width portion extending to the side of said at least two leads which is wider in a width than said support section; and
   a laser chip secured to said heat sink section.

9. An optical pickup device comprising:
   a semiconductor laser;
   a diffraction grating which is provided in front of said semiconductor laser and diffracts a beam of said semiconductor laser;
   a beam splitter which separates the light returned by being reflected on a disk from the beam passed through said diffraction grating,
   a collimator lens which collimates the beam passed through said beam splitter;
   a reflecting mirror which bends the beam passed through said collimator lens at a right angle;
   an objective lens which focuses the beam reflected by said reflecting mirror on a disk; and
   a light detector which detects the light reflected from said disk and separated by said beam splitter;
   wherein said semiconductor laser is the semiconductor laser as claimed in claims 1 or 6.

* * * * *